United States Patent [19]
Liu

[11] 3,972,012
[45] July 27, 1976

[54] APPARATUS FOR MOUNTING A DIODE IN A MICROWAVE CIRCUIT

[75] Inventor: Shing-gong Liu, Princeton, N.J.

[73] Assignee: RCA Corporation, New York, N.Y.

[22] Filed: Dec. 23, 1974

[21] Appl. No.: 535,815

[52] U.S. Cl. .............................. 333/84 M; 357/79; 357/81
[51] Int. Cl.² ..................... H01P 3/00; H01L 23/42; H01L 23/44; H01L 23/02
[58] Field of Search ........................ 357/81, 79, 74; 333/84 M

[56] References Cited
UNITED STATES PATENTS

| | | | |
|---|---|---|---|
| 3,278,763 | 10/1966 | Grove | 333/84 M |
| 3,350,655 | 10/1967 | Saad | 357/79 |
| 3,878,486 | 4/1975 | Dean | 333/84 M |
| 3,908,188 | 9/1975 | Kawamoto | 333/84 M |

*Primary Examiner*—Andrew J. James
*Attorney, Agent, or Firm*—Edward J. Norton; Joseph D. Lazar; Robert M. Rodrick

[57] ABSTRACT

Apparatus for mounting a diode in a microwave circuit for making electrical contact between the circuit and ground and for dissipation of heat between the diode and a heat sink. The diode, supported on a thermally and electrically conductive member, is resiliently pressed in electrical contact with the microwave circuit. A tapered collar on the member is elastically deformably wedged into a tapered aperture formed in a heat sink. The wedged collar tightens firmly around the member establishing good thermal and electrical conduction from the diode to the heat sink and ground. Disassembly is facilitated because of the elastically deformed collar.

12 Claims, 4 Drawing Figures

APPARATUS FOR MOUNTING A DIODE IN A MICROWAVE CIRCUIT

The invention herein described was made in the course of or under a contract or subcontract thereunder with the U.S. Atomic Energy Commission.

BACKGROUND OF THE INVENTION

1. Field of the Invention

This invention relates to an apparatus for mounting a diode in a microwave circuit and, more particularly, in a microwave circuit in which the mounting provides for electrical contact between the diode and the circuit and for heat dissipation from the diode to a heat sink.

2. Description of the Prior Art

Diodes mounted in microwave circuits require one terminal to make electrical contact with the circuit and the other terminal to make electrical contact with the ground plane. For this reason, some diodes are bonded to the circuit line with wires or ribbon to ensure electrical contact. The circuit line is broken to receive the diode prior to bonding. Dimensional tolerances of the wire or ribbon and the integrity of the bond affect the direct connection between the diode and circuit line introducing thereby parasitics or undesirable inductances reducing the RF efficiency of the circuit. High-power diodes in a microstrip circuit require the effective dissipation of heat for desirable circuit performance. To achieve a good thermal path from the diode to a heat sink, the diode is mounted on a support which is threadably engaged to the heat sink. This mounting serves also as the contact of the other diode terminal to ground. Small contact areas between the diode support and heat sink will produce large thermal gradients resulting in degradation of circuit performance and reduction of life span. The mounting procedure of bonding wires or ribbon to the circuit line and screwing the diode support to the heat sink or ground hinders replaceability of the diode and limits the physical size of the diode to a closely toleranced dimension.

SUMMARY OF THE INVENTION

The present invention is directed to the mounting of a high-power diode in a microstrip circuit. Electrical contact between one terminal of the diode and the microstrip circuit is made by resiliently pressing the terminal of the diode against the circuit. The diode is supported by a thermally and electrically conductive member. A tapered collar on the member is elastically deformably wedged into a tapered aperture in a heat sink. The wedged collar tightens firmly around the member making good electrical contact between the other terminal of the diode and the heat sink or ground and establishing good thermal conduction from the diode to the heat sink.

DETAILED DESCRIPTION OF THE PREFERRED EMBODIMENT

Figure 2:
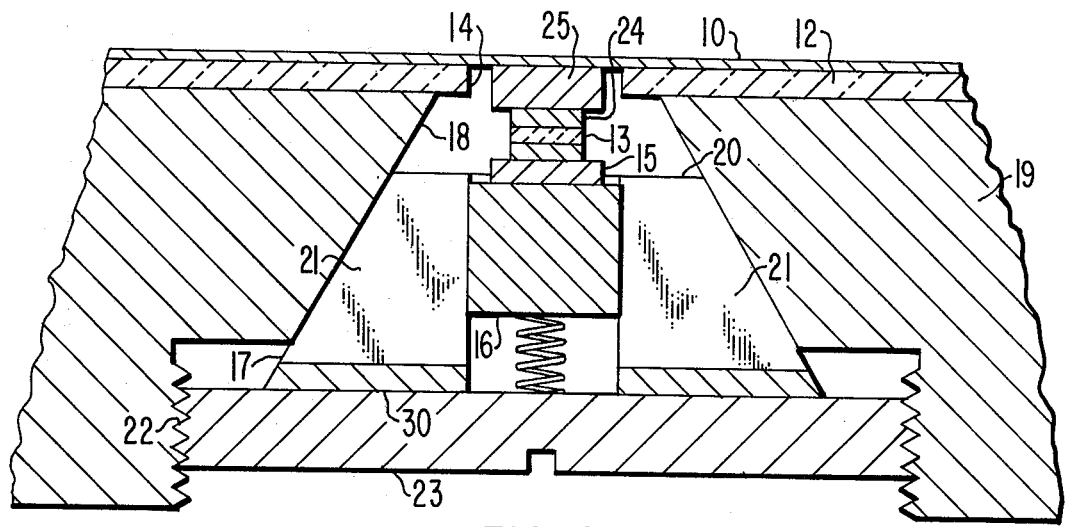
FIG. 2 is a sectional view of a diode mounting according to a preferred embodiment of the invention as seen along viewing line 2—2 of FIG. 1.
Figure 1:
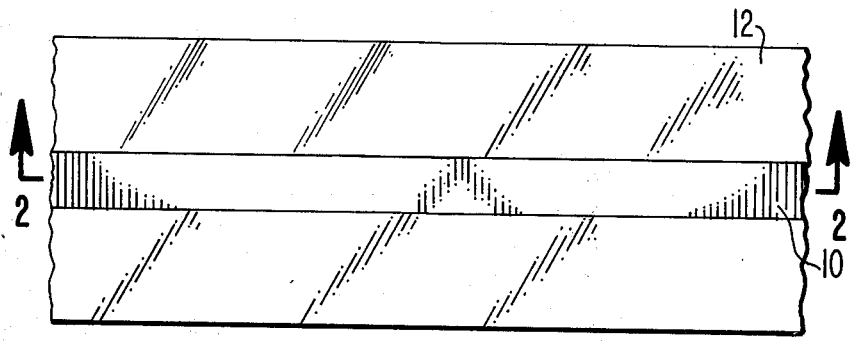
FIG. 1 is a plan view of an apparatus including a microstrip circuit and mounting block for embodying the invention.

Referring to FIGS. 1 and 2, a diode 13 having terminals 24 and 15 is shown in a microwave circuit 10 mounted on block 19. A disk 25, suitably gold-plated copper, may be positioned between terminal 24 and microwave circuit 10 to increase the flexure strength of the strip line portion of circuit 10. As such, the disk 25 is an integral part of the circuit 10. In this embodiment, microwave circuit 10 is a microstrip circuit or conductor metalized on a non-conductive substrate 12 and chemically etched to the desired circuit pattern. Any form of microstrip circuit, however, may be used. An aperture 14 is formed in the substrate 12 to permit contact between terminal 24 of diode 13 and the microstrip 10. Substrate 12 is mounted on a block 19 of solid copper which serves both as the heat sink and ground plane.

A tapered aperture 18 of conical form converging at the substrate is formed through the block 19. Substrate 12 is mounted on block 19 such that aperture 14 in substrate 12 is in register with the tapered aperture 18 of block 19.

Diode 13 to be mounted in contact with microstrip circuit 10 is supported by a thermally and electrically conductive pedestal member 16. Preferably, member 16 is formed of copper because of its thermal and electrical properties and because it is easily soldered to other metals. Member 16 may also be made of other metals such as silver, aluminum, or brass. To enhance the thermal and electrical path between diode 13 and member 16, it is preferable to braze one of the diode terminals 15 to member 16. Gold-plating copper member 16 will prevent oxidation of the copper during brazing. It is desirable, although not necessary, for ease of assembly, as will be described, that member 16 be cylindrical.

A truncated conical collar 20 tapered on the outer surface 17 (see FIG. 3 and 4) to substantially mate with the tapered surface of aperture 18 in block 19 is positioned around member 16 as shown in FIG. 2.

The free terminal 24 of diode 13 is pressed resiliently into intimate contact with microstrip circuit 10 to make a direct electrical connection between diode 13 and microstrip circuit 10. Collar 20 is wedged by positive means against the surface of tapered aperture 18. The wedging of collar 20 causes collar 20 to tighten firmly around member 16. Thus, intimate contact between block 19 and collar 20 and between collar 20 and member 16 is achieved. The dimensions of tapered aperture 18, collar 20, and member 16 are determined such that large surface areas are in intimate contact. The intimate contact of these surfaces increases thermal and electrical conduction at the interfaces of the parts establishing good heat transfer from diode 13 to heat sink 19 and good electrical contact from microstrip circuit 10 to ground 19.

The positive means for wedging collar 20 against tapered aperture 18 is accomplished preferably by a screw 23 substantially concentric with tapered aperture 18 engaging internal threads 22 formed in block 19. Tightening screw 23 against collar 20 wedges collar 20 against tapered aperture 18. The wedging action of the outer surface of collar 20 results in a constriction of the inner surface of collar 20 thereby tightening around member 16.

For resiliently pressing the diode 13 in electrical contact with the microstrip circuit 10, it is preferable to utilize a spring 11 which is elastically deformed between the screw 23 and member 16 supporting diode 13. Spring 11 is selected to provide a force resulting from its deformation sufficient to press diode 13 in intimate contact with microstrip circuit 10 without damaging or deforming the microstrip 10. Since the electric circuit from microstrip circuit 10 to ground 19 is formed by the low impedance path consisting of the contact between microstrip circuit 10, diode 13, diode supporting member 16, collar 20, and block 19, spring 11 is effectively isolated from the electric circuit. In other prior art mounting arrangements, it will be noted, a coil spring is usually used to achieve contact pressure between a diode and a microwave circuit as well as to achieve electrical contact between the diode and ground. Such spring arrangements in the electric circuit create undesirable inductances detrimentally affecting circuit performance since the coil spring is essentially an inductor. The arrangement of the present invention provides a resilient contact of the diode in the microstrip without the deleterious effect of introducing the inductive effect of such springs into such circuits.

To establish the desired effects and also to permit the apparatus incorporating the invention to be disassembled should the diode need to be repaired or be replaced, according to a preferred form of the invention, the structure provides for elastic tightening of the components upon assembly as will be described. Permanent deformation and consequent binding of the parts upon assembly does provide the thermal and electric effects desired but disassembly of those parts can be difficult if not impossible. To disassemble easily the apparatus, it is preferable to select the material of collar 20 such that the collar is more resilient i.e., more elastically deformable, than block 19 and will thereby preferentially elastically deform when forced into contact with block 19, block 19 being formed as previously described of copper. Collar 20 is preferably made of coin-silver, which is an alloy of silver having good thermal and elastic properties. Beryllium copper may also be used for collar 20 because it also has good elastic properties and even though less thermally conductive than coin-silver, it is advantageously much less costly.

Figure 3:
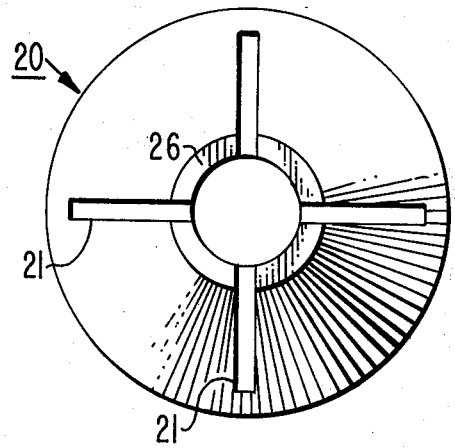
FIG. 3 is a plan view of the collar.
Figure 4:
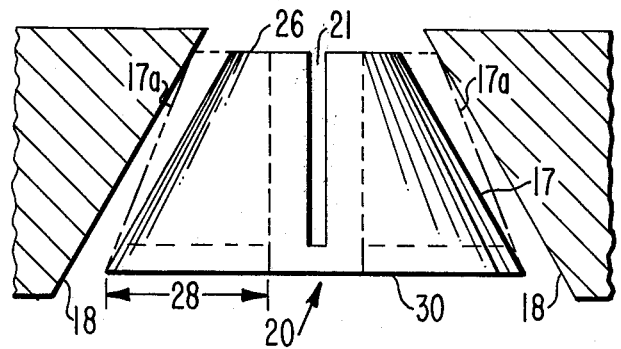
FIG. 4 is a fragmentary portion of the side view of the collar shown in FIG. 3 disposed in the apparatus of FIG. 2.

To achieve the desired elastic deformation property of the apparatus, it is also preferable to form at least two slots 21 in collar 20 as shown in FIGS. 3 and 4 so that upon assembly, the deformation of collar 20 due to the wedging action described above is extended into the space provided by the slots 21. It should be noted that the slots 21 define a plurality of finger-like members which will flex or bend as collar 20 is wedged into aperture 18. The aperture 18, collar 20, and member 16 are formed to permit a small amount of deformation of collar 20 upon wedging so that together with the elastic properties of collar 20 the stresses induced in collar 20 are below the elastic limit. Thus the deformation in the collar will not be permanent and the desired resiliency for disassembly is achieved.

The slots 21 are formed in collar 20 so that deformation achieved by the wedging action effected during the assembly occurs at the smaller radial portion 26 of collar 20. The larger radial portion 28 of collar 20 serves as the fulcrum for the deformation of the smaller portion 26 and since the slots do not extend the entire length of collar 20, the larger portion 28 is not elastically deformable. Therefore, is is preferable for assembly purposes to form the taper of collar 20 so that the smaller radial portion 26 will make contact with the surface of aperture 18 upon assembly before the larger radial portion 28 makes contact with any surface portion of aperture 18. If the tapers of collar 20 and aperture 18 are identical elastic tightening will not be achieved since the smaller and larger diameter portions of collar 20 will be contacting aperture 18 simultaneously and the larger diameter, not being elastically deformable, will tend to bind permanently in aperture 18. Thus, by forming a mismatch between taper 17 and aperture 18 the smaller diameter of collar 20 will make initial contact with the surface of aperture 18 during the wedging action. As seen in FIG. 4, taper 17a is formed to converge with the surface of aperture 18 such that the smaller portion 26 of collar 20 will contact the surface of aperture 18 upon assembly before the larger portion 28 contacts the surface. As collar 20 is wedged into aperture 18, the smaller diameter deforms and surface 17a becomes more parallel to aperture 18 until the respective surfaces are in contact. The dimensions of taper 17a and aperture 18 and the clearance between collar 20 and member 16 are determined so that tight constriction of collar 20 around member 16 occurs when surface 17a makes contact with the surface of aperture 18. At the point where the tapered surfaces mate and collar 20 tightens around member 16, collar 20 will be locked in place and vertical displacement of member 16 in the direction of wedging will be prevented thereby avoiding additional unnecessary forces on microstrip 10, the vertical position of the diode being concomitantly established by the coaction of spring 11 as will be described.

The apparatus of the embodiment described above is assembled as follows: diode 13 affixed to supporting member 16 is placed into aperture 18 such that the free terminal 24 will contact the under surface of the microstrip 10 mounted on block 19 over aperture 18. Collar 20 is placed around member 16 and into aperture 18 until the smaller portion 26 of collar 20 makes contact with the surface of aperture 18. As screw 23 is rotated to contact the bottom surface 30 of collar 20, the screw wedges collar 20 until the collar is constricted tightly around member 16 subsequently to the positioning of diode 13 against microstrip circuit 10. This sequent action is achieved by deforming spring 11 against member 16 such that sufficient force and displacement is provided for diode 13 to make intimate contact with microstrip 10 before collar 20 tightens around member 16 and to do so without rupturing microstrip 10. This is achieved by selecting a spring as previously described such that its elastic properties and spring force resulting from deformation are sufficient to press diode 13 into intimate contact with microstrip 10 without damaging or deforming the microstrip 10. The length of spring 11 is selected so that upon assembly elastic deformation of spring 11 occurs before screw 23 contacts the bottom surface 30 of collar 20. It is mainly in this interval that the desired force is achieved to press diode 13 into contact with microstrip 10. Typically, a force in the order of a few grams is adequate. The dimensions of the components are arranged to provide little vertical movement of collar 20 in response to the wedging action, preferably less than 0.010 inches after the screw 23 makes contact with collar 20. Therefore, there is little additional force produced in spring 11 after screw 23 contacts collar 20 and the spring deformation will still be elastic. It is to be noted that subsequent to the constriction of collar 20 around member 16, diode 13 is maintained in contact with microstrip 10 by the constriction of collar 20. Upon constriction, the force exerted upon member 16 by spring 11 is effectively negated, the purpose of spring 11 to make contact between diode 13 and microstrip 10 before constriction having been accomplished. Assembly of the apparatus in this manner will not only permit easy disassembly but will also allow various diode sizes and not restrict the diodes to tightly specified dimensions. Another advantage of this embodiment as described above is that the components are formed to be self-aligning upon assembly.

Upon disassembly, screw 23 is loosened relaxing the wedging action of collar 20, thereby permitting relief of the elastic stresses induced in collar 20 during wedging. Since the collar has not been deformed beyond its elastic limit relief of the stresses will permit collar 20 to return to its original configuration, thus releasing the constriction of collar 20 around member 16. Further loosening of screw 23 will relieve the compression of spring 11 and allow for easy break in the contact between diode 13 and microstrip 10. Removal of screw 23 will permit access to diode 13 for easy removal or repair and collar 23 and spring 11 can be utilized repeatedly if need be upon reassembly.

According to the invention, a direct connection between diode 13 and microstrip circuit 10 is achieved by resilient contact pressure. Heretofore, the manner of establishing a direct connection between a diode and certain microstrip circuits was accomplished by bonding wire or ribbon from the diode to the circuit. The circuit line was broken to effectuate mounting of the diode in the line. The integrity of the bond and the tolerance variations in the wire or ribbon created inconsistencies in the circuitry which resulted in parasitics or undersirable inductances reducing RF efficiency and circuit performance. According to the present invention, the variables which cause such inconsistencies are minimized, if not eleiminated, thereby increasing circuit performance and reproducibility.

The use of a high-power diode requires the effective dissipation of heat to produce the desired circuit performance for the intended life of the device. Heretofore, high-power diodes were mounted on a support which was attached as by threaded members to a heat sink. Minimal contact areas between the heat sink and diode support resulted in large thermal gradients increasing diode temperature and shortening the intended life of the diode. The present invention increases the surface area of contact between the diode and heat sink as described above making the dissipation of heat more effective and improving the power handling capability of the apparatus.

It is now to be appreciated that the invention has an advantage in mechanical assembly and disassembly. As explained above, direct electrical connection from a diode to a microstrip circuit and improved heat dissipation capability from the diode to a heat sink are achieved without deforming, breaking, tearing, or rupturing the microstrip circuit. Furthermore, for the purposes of mechanical assembly, the overall size of the diode and, more particularly, the dimension of the diode between its terminals is not as critical for use in the apparatus of the present invention as is generally required in the prior art. Accordingly, wide variations in diode dimensions are permissible. Another advantage of this invention is that the diode may be replaced, if need be, without interrupting the microstrip circuit.

What is claimed is:

1. An apparatus for mounting a diode in a microwave circuit, said microwave circuit including a conductor affixed to a substrate, said substrate having an aperture for receiving said diode to make contact with the surface portion of said conductor in register with said aperture, comprising:
   means for resiliently pressing said diode into electrical contact with said conductor through said aperture; and
   support means for fixedly supporting said resilient means, said support means having an elastically deformable portion to hold said diode substantially rigidly in contact with said conductor whereby said support means is prevented from jamming in position.

2. An apparatus for mounting a high-power diode in a microwave circuit comprising:
   a. a mounting block for heat sinking and electrical ground;
   b. a microwave circuit affixed to a substrate, said substrate being mounted on said block;
   c. a tapered aperture extending through said block converging to said substrate;
   d. an aperture in said substrate in register with said tapered aperture for receiving said diode;
   e. a thermally and electrically conductive member for supporting said diode in said aperture;
   f. a tapered collar on said member shaped to mate substantially with said tapered aperture; and
   g. means for wedging said collar against the tappered surface of said aperture and resiliently pressing one terminal of said diode in electrical contact with said microwave circuit, said collar establishing a good thermal path from said diode to said block and electrical conduction from the other terminal of said diode to said block.

3. An apparatus according to claim 2, wherein said microwave circuit is a microstrip circuit.

4. An apparatus according to claim 2, wherein the means for wedging said collar against the tapered wall of said aperture comprises a screw engaging internal threads formed in said block substantially concentric with said tapered aperture.

5. An apparatus according to claim 4, wherein the means for resiliently pressing said diode comprises a coil spring compressed between said member and said screw.

6. An apparatus according to claim 2, wherein said collar is coin-silver for thermal and elastic properties, said collar having at least two slots to permit elastic deformation of said collar in said aperture and constriction of said collar around said member in response to wedging action of said collar against the tapered surface of said aperture.

7. An apparatus according to claim 6, wherein said collar has a larger radial portion and a smaller radial portion and the tapered outer surface of said collar is formed to converge with the surface of aperture such that upon assembly of said collar on said member in said aperture said smaller radial portion of said collar contacts the surface of said aperture prior to contact of said larger portion of said collar with the surface of said aperture and in response to said wedging means said collar deforms until the tapered outer surface of said collar becomes parallel with and contacts the surface of said aperture.

8. An apparatus according to claim 2, wherein said member is gold-plated copper.

9. An apparatus according to claim 2, wherein said diode is brazed to said member.

10. An apparatus according to claim 2, wherein said member is cylindrical.

11. An apparatus according to claim 2, wherein said collar is beryllium copper.

12. An apparatus according to claim 2, wherein said member is a thermally and electrically conductive metal selected from the group consisting of silver, aluminum, and brass.

* * * * *

UNITED STATES PATENT OFFICE
CERTIFICATE OF CORRECTION

PATENT NO. : 3,972,012
DATED : July 27, 1976
INVENTOR(S) : Shing-gong Liu

It is certified that error appears in the above-identified patent and that said Letters Patent are hereby corrected as shown below:

Column 1, line 12 "microwave circuit in" should be
--microstrip circuit in--;
Column 1, lines 44 and 45 "the mounting of a high power diode in a microstrip" should be --an apparatus for mounting a diode in a microwave--;
Column 1, line 47 "microstrip" should be --microwave--.

Signed and Sealed this

Ninth Day of November 1976

[SEAL]

Attest:

RUTH C. MASON
Attesting Officer

C. MARSHALL DANN
Commissioner of Patents and Trademarks